(12) United States Patent
Fister et al.

(10) Patent No.: US 6,324,657 B1
(45) Date of Patent: Nov. 27, 2001

(54) ON-CLIP TESTING CIRCUIT AND METHOD FOR IMPROVING TESTING OF INTEGRATED CIRCUITS

(75) Inventors: Wallace E. Fister, Meridian; Aaron Schoenfeld, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/096,488

(22) Filed: Jun. 11, 1998

(51) Int. Cl.[7] ............................ G06F 11/00; H03K 19/00; G11C 24/00
(52) U.S. Cl. ........................ 714/42; 714/719; 714/735
(58) Field of Search .......................... 714/25, 27, 30, 714/37, 42, 40, 48, 718, 719, 722, 723, 745, 733, 734, 735, 736

(56) References Cited

U.S. PATENT DOCUMENTS

| | | | |
|---|---|---|---|
| 5,062,109 | * 10/1991 | Ohshima et al. | 714/719 |
| 5,416,782 | * 5/1995 | Wells et al. | 714/719 |
| 5,568,437 | * 10/1996 | Jamal | 365/201 |
| 5,659,549 | * 8/1997 | Oh et al. | 714/720 |
| 5,673,270 | * 9/1997 | Tsujimoto | 714/718 |
| 5,689,466 | * 11/1997 | Qureshi | 365/201 |
| 5,757,815 | * 5/1998 | Simogama et al. | 714/718 |
| 5,982,681 | * 11/1999 | Schwarz | 365/201 |
| 6,019,502 | * 2/2000 | Baeg et al. | 714/718 |
| 6,032,274 | * 2/2000 | Manning | 714/718 |

FOREIGN PATENT DOCUMENTS

0356999A2 * 3/1990 (EP) .......................... G11C/29/00

* cited by examiner

*Primary Examiner*—Gail Hayes
*Assistant Examiner*—Christopher A. Revak
(74) *Attorney, Agent, or Firm*—Dorsey & Whitney LLP

(57) ABSTRACT

An on-chip test circuit in an integrated circuit includes a comparison circuit and a fail data register. An output of the comparison circuit is coupled to an input to the fail data register. The comparison circuit includes a first group of inputs coupled to outputs of a function circuit in the integrated circuit. The comparison circuit also includes a second group of inputs coupled to a source of expect data associated with normal function circuit performance. When a comparison between read data from the outputs of the function circuit and corresponding expect data indicates malfunction of the function circuit, data related to the malfunction are stored in the fail data register. A separate integrated circuit select line is coupled to each integrated circuit to allow transmission of the stored failure data without bus contention. As a result, many integrated circuits that are being tested may share an I/O bus, because the integrated circuits under test only output failure data on the I/O bus. Further, each integrated circuit only provides failure data to an external test data evaluation apparatus in response to selection signals from the external test data evaluation apparatus. The efficiency with which integrated circuits may be tested is thereby increased.

64 Claims, 6 Drawing Sheets

ON-CLIP TESTING CIRCUIT AND METHOD FOR IMPROVING TESTING OF INTEGRATED CIRCUITS

TECHNICAL FIELD

The present invention relates generally to testing of integrated circuits, and more specifically to a method and apparatus that reduces the time and testing resources needed for testing of integrated circuits.

BACKGROUND OF THE INVENTION

Integrated circuits are extensively tested both during and after production, and, in some cases, routinely during use after they have been installed in products. For example, memory devices, such as random access memories ("RAMs") and dynamic random access memories ("DRAMs"), are tested during production at the wafer level and after packaging, and they are also routinely tested each time a computer system using the DRAMs executes a power-up or "boot" routine when power is initially applied to the computer system. As the capacity of DRAMs and other memory devices continues to increase, the time required to test the DRAMs continues to increase, even though memory access times continue to decrease.

A typical RAM integrated circuit includes at least one array of memory cells arranged in rows and columns. Each memory cell must be tested to ensure that it is operating properly. In a typical prior art test method, data having a first binary value (e.g., a "1") are written to and read from all memory cells in the arrays, and thereafter data having a second binary value (e.g., a "0") are typically written to and read from the memory cells. A memory cell is determined to be defective when the data that is read from the memory cell does not equal the data that was written to the memory cell. As understood by one skilled in the art, other test data patterns may be utilized in testing the memory cells, such as an alternating bit pattern, e.g., 101010. . . , written to the memory cells in each row of the arrays.

One situation requiring testing of memory integrated circuits occurs during fabrication of integrated circuits. Fabrication yields are reduced when fabrication errors occur. Testing of integrated circuits during fabrication allows the sources of some fabrication errors to be promptly identified and corrected. Testing during fabrication may reduce costs by reducing the number of integrated circuits affected by a given fabrication error.

Another situation requiring testing of integrated circuits also occurs in fabrication of memory integrated circuits. Defective memory cells are identified by testing and are replaced with non-defective memory cells from a set of spare or redundant memory cells. In one conventional method for replacing defective memory cells, fuses on the integrated circuit are blown in a pattern corresponding to the pattern of defective memory cells to select rows or columns of redundant memory cells. The pattern is then read to replace the rows or columns that include the defective memory cells.

FIG. 1 is a simplified block diagram of several integrated circuits 10 and an automated tester 12 according to the prior art. Separate buses 14 are dedicated to couple each of the integrated circuits 10 to the automated tester 12. The data buses 14 convey stimuli, known as background data, from the automated tester 12 to function circuits 16, such as memory arrays, contained in the integrated circuits 10 that are being tested. Each function circuit 16 generates a response, such as read data, from the background data that are sent to that function circuit 16. The data buses 14 also convey the read data from each function circuit 16 back to the automated tester 12. The automated tester 12 compares the read data from each integrated circuit 10 that is being tested to a corresponding set of expect data. The expect data correspond to read data that would be provided by the integrated circuit 10 if its function circuit 16 was operating properly. When the read data and the corresponding expect data match, the integrated circuit 10 is considered to be functioning normally. When the read data do not match the corresponding expect data, the integrated circuit 10 that provided the read data is considered to be malfunctioning.

Each bus 14 can only convey data unambiguously from one integrated circuit 10 at a time to the automated tester 12. In turn, the automated tester 12 can only accommodate a finite number of buses 14, limiting the number of integrated circuits 10 that may be tested at one time. The number of memory integrated circuits 10 that may be coupled to the automated tester 12 at one time is known as the "fanout" for the automated tester 12.

There is a need for an on-chip test circuit to test function circuits in a group of integrated circuits without requiring a separate module or control integrated circuit to read output signals from the function circuits in order to compare the output signals with expected output signals.

SUMMARY OF THE INVENTION

An on-chip test circuit is included in an integrated circuit for testing function circuits in the integrated circuit and for storing failure data from the tests. The on-chip test circuit includes an expect data register and a comparison circuit having a first input coupled to an output of the function circuits and a second input coupled to an output of the expect data register. The on-chip test circuit also includes a fail data register having an input coupled to an output of the comparison circuit. The fail data register stores data describing memory array failures. The combination of the comparison circuit and the fail data register allows many integrated circuits to be tested at one time without waiting for the each integrated circuit to provide read data to a tester and without bus contention. Testing of integrated circuits is thereby facilitated, reducing the time required for testing the integrated circuits and increasing the practical fanout from automated testers.

DETAILED DESCRIPTION OF THE INVENTION

Figure 2:
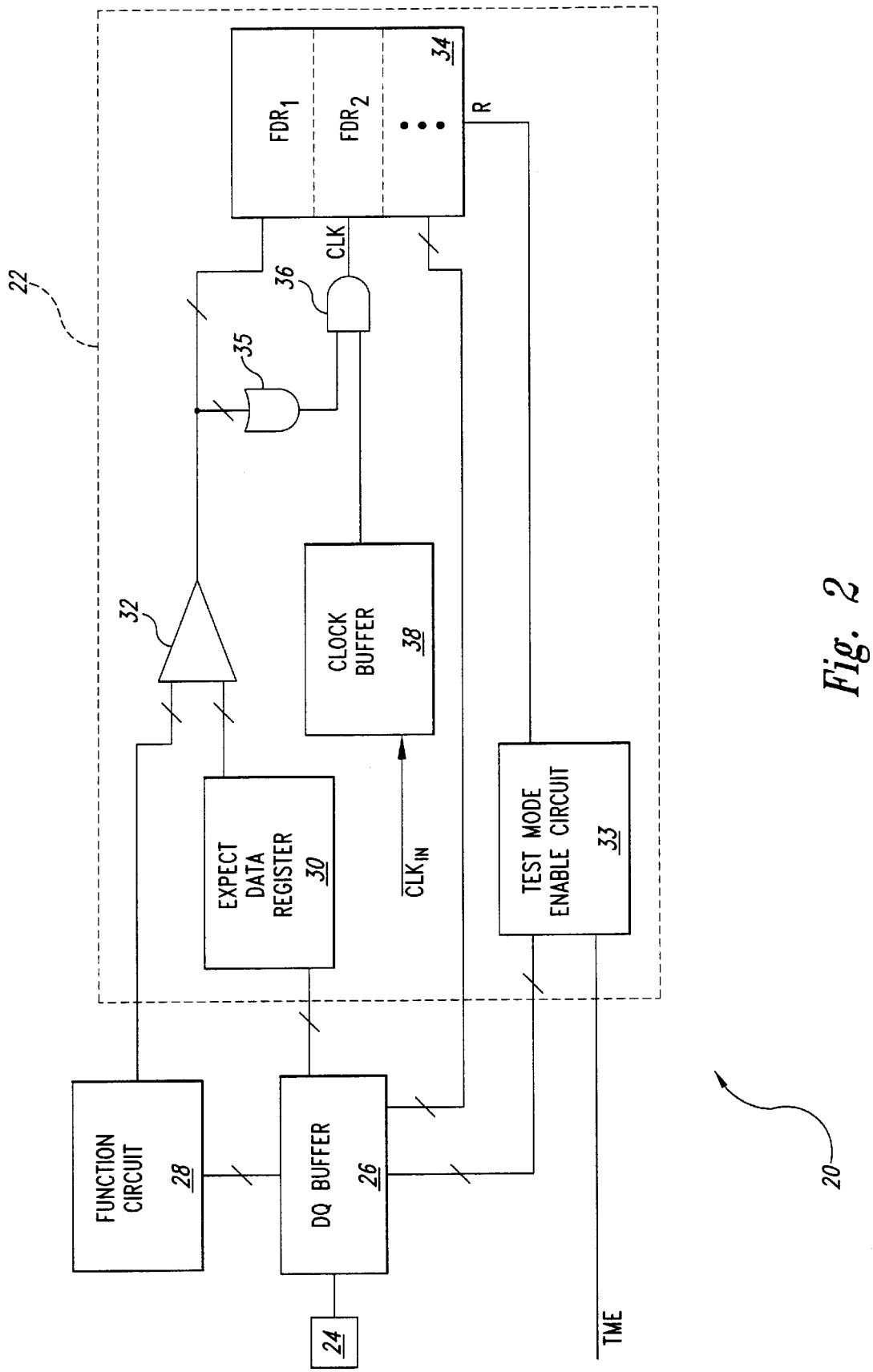
FIG. 2 is a simplified block diagram of a portion of an integrated circuit including an on-chip testing circuit in accordance with an embodiment of the present invention.

FIG. 2 is a simplified block diagram of a portion of an integrated circuit 20 including an on-chip testing circuit 22 in accordance with an embodiment of the present invention. The integrated circuit 20 also includes I/O pins or pads 24 coupled to a DQ buffer 26, allowing data, address and control signals to be coupled between external circuits (not shown in FIG. 4) and a function circuit 28. The I/O pins or pads 24 used to couple signals to and from the integrated circuit 20 typically include between one and sixty-four pins or pads. In one embodiment, the function circuit 28 includes a microprocessor. In another embodiment, the function circuit 28 includes a memory circuit such as a RAM, DRAM or synchronous DRAM.

The on-chip testing circuit 22 includes an expect data register 30 having an input bus coupled to the DQ buffer 26. A comparison circuit 32 includes a first input coupled to the expect data register 30 and a second input coupled to an output of the function circuit 28. A test mode enable circuit 33 is responsive to signals provided on a control line TME. A fail data register 34 has a reset input R coupled to the test mode enable circuit 33 and has one or more data inputs coupled to an output of the comparison circuit 32. In one embodiment, the on-chip testing circuit 22 also includes an OR gate 35 having inputs coupled to the output of the comparison circuit 32 and an output coupled to a first input of an AND gate 36. The AND gate 36 has a second input coupled to an output of a clock input buffer 38. The DQ buffer 26, the function circuit 28 and the expect data register 30 all couple data in or out in response to a clock signal, e.g., $CLK_{IN}$.

The on-chip test circuit 22 operates in one of two modes, a test mode and a pass-through mode, as determined by the state of the test mode enable circuit 33. In the pass-through mode, an external circuit (not shown in FIG. 2) provides signals on the control line TME causing the test mode enable circuit 33 to deactivate all address and control signals that it develops, allowing the integrated circuit 20 to function in a normal mode.

When the external circuit activates the test mode enable circuit 33, the on-chip test circuit 22 operates in the test mode to test the function circuit 28 in the integrated circuit 20. In the test mode of operation, command signals are coupled to the test mode enable circuit 33 from the external circuit in order to (i) put the integrated circuit 20 into the test mode, (ii) clear the fail data register 34 using a signal coupled to a reset input R, (iii) load background data into the function circuit 28 through the DQ buffer 26 and (iv) load expect data into the expect data register 30 through the IO pins or pads 24 of the DQ buffer 26. The comparison circuit 32 then compares read data from the function circuit 28 with corresponding expect data from the expect data register 30 and provides one or more output signals to the fail data register 34 when the read data do not match the corresponding expect data.

In one embodiment, the expect data register 30 is omitted. In this embodiment, the expect data may be supplied to the comparison circuit 32 through the I/O pins or pads 24 and the DQ buffer 26. Alternatively, the expect data may be stored in, e.g. a ROM (not illustrated) that is also a part of the test circuit 22, or may be stored or generated in the integrated circuit 20.

In another embodiment, the comparison circuit 32 may be a group of exclusive OR ("XOR") gates (not illustrated) performing bitwise comparisons between the read data from the function circuit 28 and the corresponding expect data. In this embodiment, the output bits from the comparison circuit 32 will all be logical zeroes unless there is an error in the read data indicating a failure in the function circuit 28.

The outputs from the comparison circuit 32 may be used to increment a clock signal to the fail data register 34 by coupling each of the output bits from the comparison circuit 32 to a separate input of the OR gate 35 and coupling an output of the OR gate 35 to a first input of the AND gate 36. A clock signal from the clock buffer 38 is coupled to a second input of the AND gate 36. The clock signal from the clock buffer 38 is then passed to the clock input CLK of the fail data register 34 only when one or more bits from the output of the comparison circuit 32 indicate a failure in the function circuit 28. The fail data register 34 then only records data when there is a mismatch between the read data and the corresponding expect data that is indicative of a failure in the function circuit 28. Recording only data relating to failures, rather than all of the results of comparing read and expect data, reduces the amount of data to be stored in the fail data register 34.

In one embodiment, the fail data register 34 may be a counter. When a single-bit counter is used, the counter can indicate only that at least one failure occurred or that no failures occurred. When a multi-bit counter is used, the fail data register 34 may record how many failures occurred, up to the capacity of the counter employed for the fail data register 34. The addition of an overflow bit provides an indication that a greater number of failures occurred than can be recorded by the counter.

In some situations, multiple tests of each integrated circuit 20 may require several sets of failure data to be stored in each integrated circuit 20. In one embodiment, the fail data register 34 is segmented into a series of sub-registers $FDR_1$, $FDR_2$ etc. each dedicated to storing failure data from one of the tests. These kinds of data may be useful in speed grading (determining the maximum clock frequency permitting reliable operation) of the integrated circuits 20, as is explained below in more detail.

When the integrated circuit 20 includes a memory circuit as the function circuit 28, it may be useful to store additional types of data in the fail data register 34. For example, it may be desirable to store addresses corresponding to defective memory locations in a failed cell address register that is part of the fail data register 34. These addresses may be used to repair the function circuit 28 or to avoid writing data to or reading data from the defective memory locations in the function circuit 28.

Figure 3:
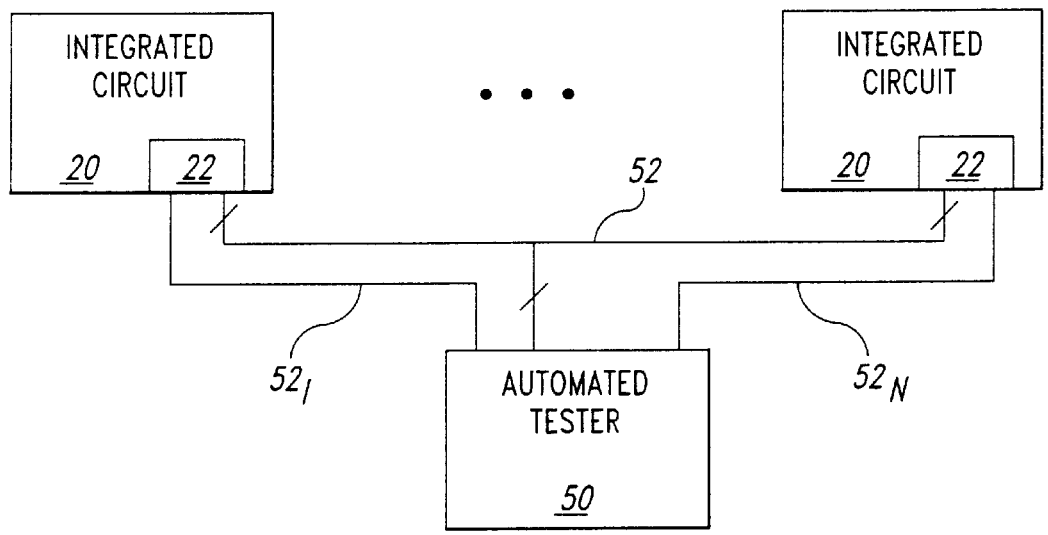
FIG. 3 is a simplified block diagram of several integrated circuits and an automated tester in accordance with an embodiment of the present invention.

FIG. 3 is a simplified block diagram of N many integrated circuits 20 and an automated tester 50 in accordance with an embodiment of the present invention. A common, i.e., shared, bus 52 couples the I/O pins or pads 24 of the integrated circuits 20 to the automated tester 50. At least one dedicated control line $52_n$, where n is an element of the set ranging from 1 to N inclusive, is also coupled between each of the control lines TME of the test mode enable circuits 33 (FIG. 2) in the N many integrated circuits 20 and the automated tester 50.

Figure 1:
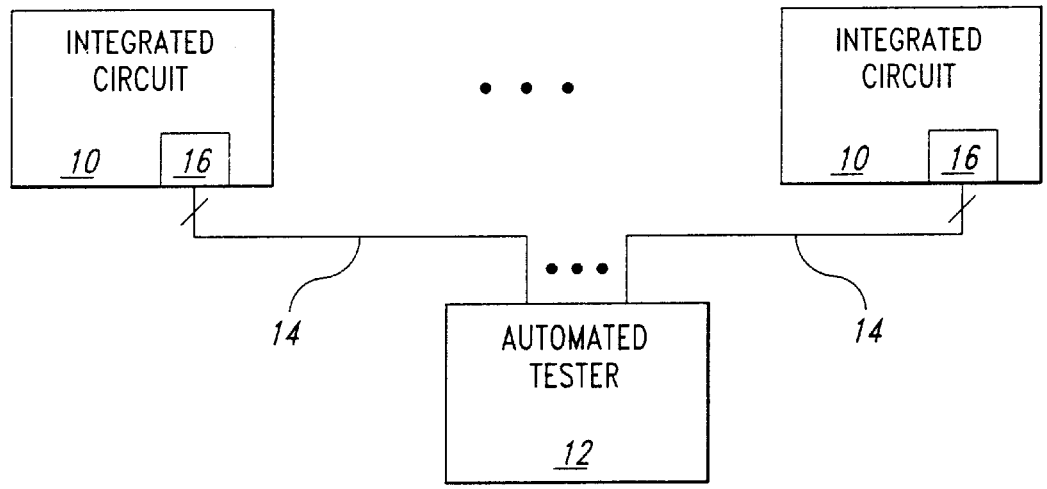
FIG. 1 is a simplified block diagram of several integrated circuits and an automated tester according to the prior art.

A first advantage that the automated tester 50 provides when testing integrated circuits 20 that include the on-chip testing circuit 22 is that the common bus 52 may be employed to send address, data and control signals to all of the integrated circuits 20 simultaneously. In other words, storing the results of the testing in the fail data registers 34 (FIG. 2) of the integrated circuits 20 allows testing of all of the integrated circuits 20 at the same time but avoids bus contention by storing test results in the fail data register 34. A second advantage of the embodiment of FIGS. 2 and 3 is that the amount of data that needs to be read from each of the integrated circuits 20 is reduced. Reading read data from, for example, every memory location in a memory array involves more data then merely reading the addresses of failed memory cells. A third advantage of the embodiment of FIGS. 2 and 3 is that testing time is reduced because the comparisons between expect data and read data are performed simultaneously in each of the integrated circuits 20 being tested, rather than being performed by the automated tester 12 of FIG. 1. A fourth advantage is that each additional integrated circuit 20 being tested only requires a single additional dedicated control line $52_n$ that is separate from the common bus 52, rather than separate buses 14 each dedicated to one integrated circuit 10.

When testing of the integrated circuits 20 is complete, the automated tester 50 may read the contents of each of the fail data registers 34, as is described in more detail below.

Figure 4:
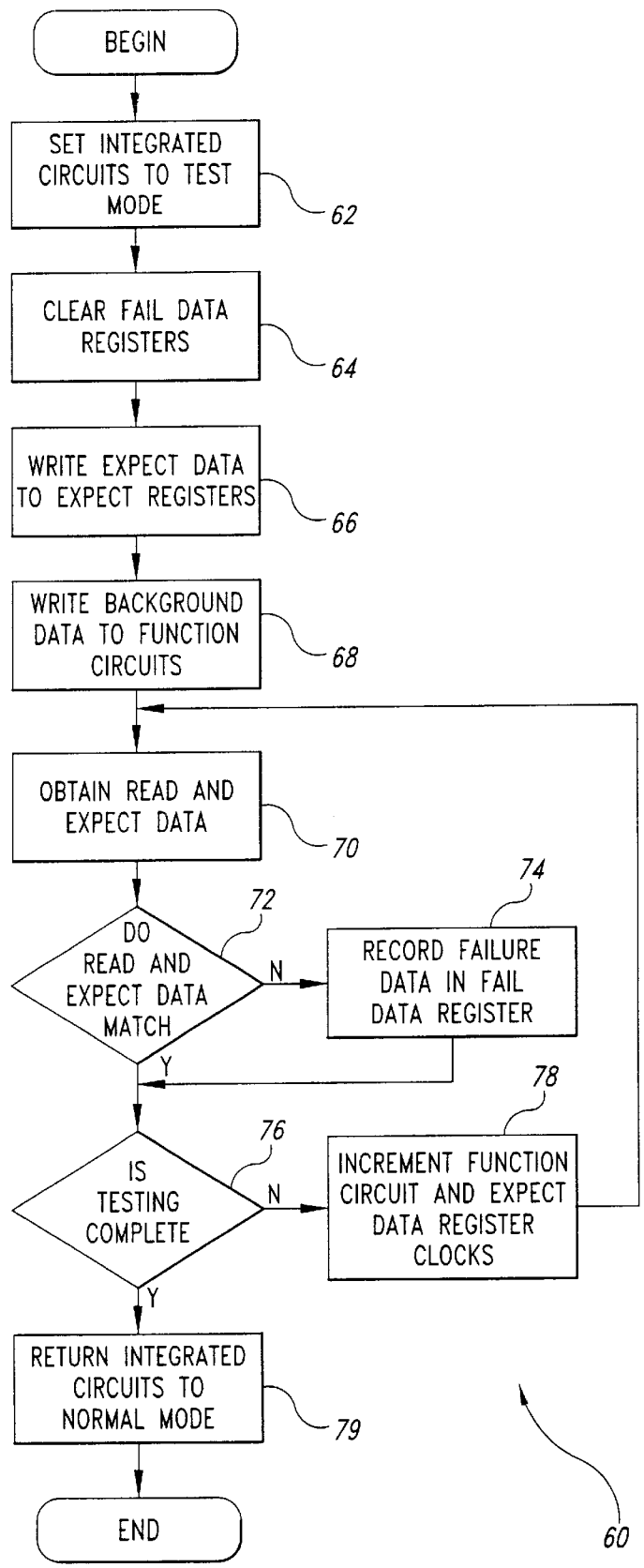
FIG. 4 is a flow chart describing an integrated circuit testing method in accordance with an embodiment of the present invention.

FIG. 4 is a flow chart describing a process 60 for testing integrated circuits 20 in accordance with one embodiment of the present invention. The process 60 tests functionality of the function circuit 28 of FIG. 2, and may use the automated tester 50 of FIG. 3 to do so, although it will be recognized that other types of controllers might be used. In a step 62, the automated tester 50 sends control signals to the integrated circuits 20 that are to be tested to set the integrated circuits 20 to the test mode. In a step 64, the automated tester 50 sends signals to the integrated circuits 20 that clear the fail data registers 34. In a step 66, the automated tester 50 writes the expect data into all of the expect data registers 30 using the common bus 52. In a step 68, the automated tester 50 writes the background data to the function circuits 28, again using the common bus 52.

In a step 70, the on-chip test circuit 22 obtains read data from the function circuit 28 and corresponding expect data from the expect data register 30. In a query task 72, the on-chip test circuit 22 compares the read data to the corresponding expect data to determine if a failure of the function circuit 28 has occurred, i.e., the read data do not match the corresponding expect data. When the on-chip test circuit 22 determines that a failure has occurred, the on-chip test circuit 22 initiates a step 74. In the step 74, the on-chip test circuit 22 stores data describing the failure in the fail data register 34. Control passes to a query task 76 when either the query task 72 determines that no failure of the function circuit 28 has occurred or after the failure data have been recorded in the step 74. The query task 76 determines if the testing has been completed.

When the query task 76 determines that the testing has not been completed, a step 78 increments the expect data register 30 and the function circuit 28 to provide new expect and read data, respectively. The on-chip test circuit 22 then returns to the step 70 and continues testing the function circuit 28. When the query task 76 determines that the testing has been completed, a step 79 returns the integrated circuit 20 to a normal mode of operation and the process 60 ends.

Figure 5:
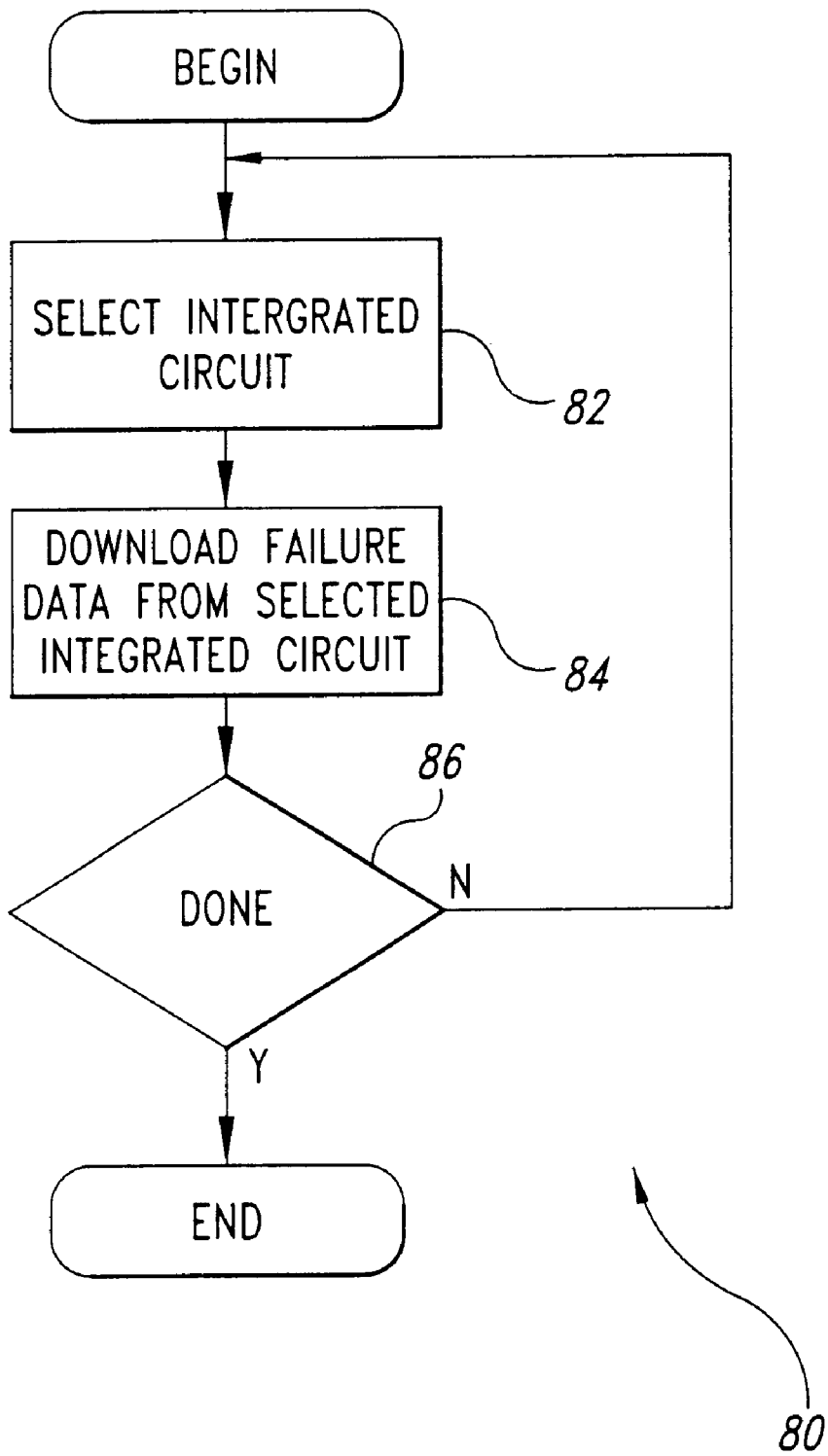
FIG. 5 is a flow chart describing a method of reading stored failure data from the fail data register of an integrated circuit that has been tested in accordance with an embodiment of the present invention.

FIG. 5 is a flow chart describing a process 80 for reading stored failure data from the fail data registers 34 (FIG. 2) of integrated circuits 20 that have been tested in accordance with an embodiment of the present invention. In one embodiment, the automated tester 50 (FIG. 3) may initiate the process 80 after the process 60 (FIG. 4) ends. In a step 82, one of the integrated circuits 20 that has new failure data to be downloaded is selected. In one embodiment, a signal is coupled to the control line TME of the selected integrated circuit 20 from the automated tester 50 by the control line $52_n$ (FIG. 3) that is dedicated to the selected integrated circuit 20.

In a step 84, the on-chip testing circuit 22 in the selected integrated circuit 20 downloads data describing the fail status of the function circuit 28 from the fail data register 34 to the automated tester 50 through the common bus 52. A query task 86 then determines if all of the failure data have been downloaded. When the query task 86 determines that not all of the failure data have been downloaded, control passes back to step 82 to select another one of the integrated circuits 20, allowing all of the integrated circuits 20 to be selected in turn. When the query task 86 determines that all of the failure data have been downloaded, the process 80 ends.

In another embodiment, the integrated circuit 20 may initiate the process 80 each time a failure occurs, or, alternatively, each time the fail data register 34 has accumulated data relevant to a predetermined number of failures. In these embodiments, the integrated circuit 20 executes the step 82 by sending an interrupt to the automated tester 50 through the control line $52_n$ (FIG. 3) that is dedicated to the selected integrated circuit 20. In this embodiment, control passes to step 84 when the query task 86 determines that not all of the failure data have been downloaded.

Figure 6:
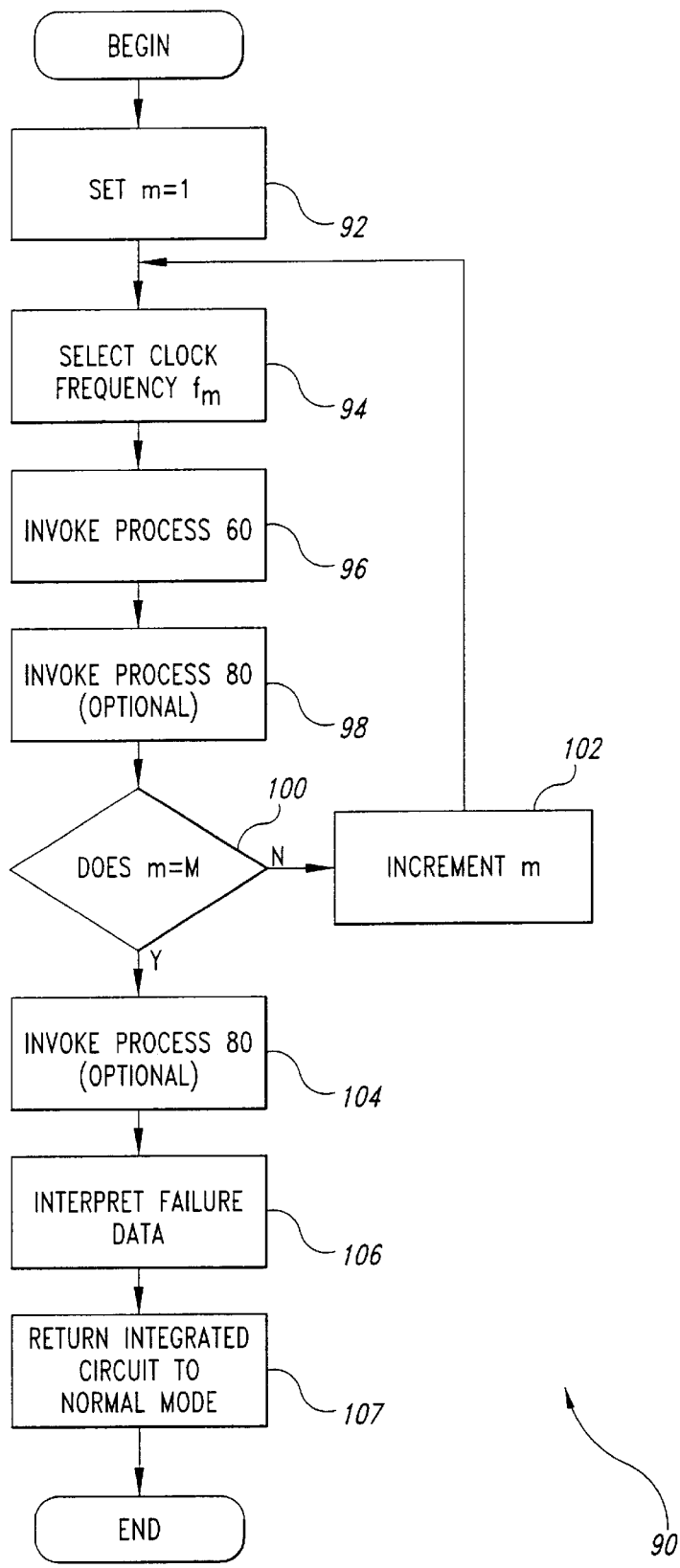
FIG. 6 is a flow chart describing an integrated circuit speed testing method in accordance with an embodiment of the present invention.

FIG. 6 is a flow chart describing an integrated circuit speed testing process 90 in accordance with an embodiment of the present invention. The speed testing process 90 tests a group of integrated circuits 20 at M many different clock frequencies to determine a maximum clock frequency for reliable operation of each of the integrated circuits 20. In a step 92, the automated tester 50 of FIG. 3 sets an index variable m to 1. In a step 94, the automated tester 50 sets an $m^{TH}$ clock frequency $f_m$ for a clock signal that is coupled to the input line $CLK_{IN}$ of the clock buffer 38 in the integrated circuit 20 of FIG. 2. A step 96 invokes the process 60 of FIG. 4. An optional step 98 invokes the process 80 of FIG. 5.

A query task 100 determines if m=M; when m≠M, a step 102 increments m and control then passes back to the step 94. When m=M, an optional step 104 may invoke the process 80 of FIG. 5 to download any stored failure data from the fail data registers 34 of the integrated circuits 20 that are being tested. Either the step 98 or the step 104 may be used to download failure data, however, the step 104 will download failure data for all M many tests, which may be separately stored, e.g., in each of the sub-registers $FDR_1$, $FDR_2$ etc. of FIG. 2, while the step 98 downloads a group of failure data for each of the m clock frequencies $f_m$ at the conclusion of the testing at each of the clock frequencies $f_m$. In either case, the step 106 evaluates failure data for each of the integrated circuits 20 to determine a maximum clock frequency for each of the integrated circuits 20 to be able to operate reliably. A step 107 then returns the integrated circuits 20 to the normal mode of operation, and the process 90 then ends.

Speed testing of integrated circuits 20 (e.g., the process 90 of FIG. 6) differs from functional testing (e.g., the process 60 of FIG. 4) because speed testing is typically carried out with integrated circuits 20 that have previously been functionally tested and that are therefore known to be functional. In the case of integrated circuits 20 that are read-write memories such as DRAMs, the integrated circuits 20 have previously been tested and defective memory cells have previously been replaced as is conventional. Accordingly, speed testing may not need addresses for memory cells that fail, and may need only the total number of failures, such as memory cell failures, in order to determine a maximum error-free clock frequency for the integrated circuit 20. When only the total number of failures is needed, the fail data register 34 may include a counter (when step 98 is used to download failure data) or a group of M many counters (when step 104 is used to download failure data). This may permit simplification of the on-chip testing circuit 22 for some applications.

Figure 7:
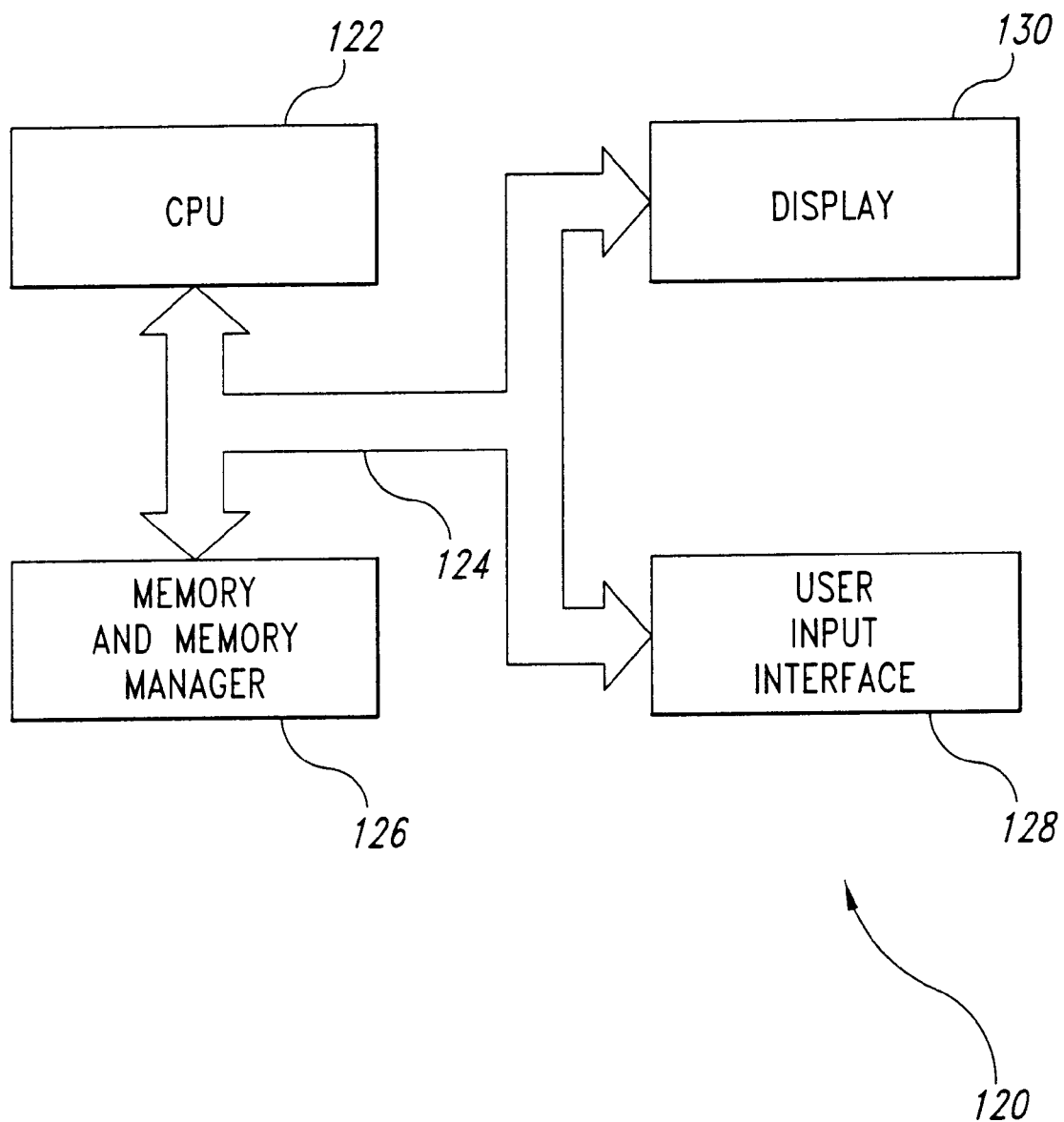
FIG. 7 is a simplified block diagram of a computer system including the integrated circuit of FIG. 2 in accordance with an embodiment of the present invention.

FIG. 7 is a simplified block diagram of a portion of a computer system 120 including the integrated circuit 20 of FIG. 2 in accordance with an embodiment of the present invention. The computer system 120 includes a central processing unit 122 for performing various computing functions, such as executing specific software to perform specific calculations or tasks. The central processing unit 122 is coupled via a bus 124 to a memory 126, a user input interface 128, such as a keyboard or a mouse, and a display 130. The memory 126 may or may not include a memory management module (not illustrated) and does include ROM for storing instructions providing an operating system and read-write memory for temporary storage of data. The processor 122 operates on data from the memory 126 in response to input data from the user input interface 128 and displays results on the display 130. The processor 122 also stores data in the read-write portion of the memory 126.

The integrated circuit 20 is particularly useful when it is a memory integrated circuit in the read-write memory portion of the memory 126, because it may then allow the memory 126 to be tested more rapidly (e.g., using the process 60 of FIG. 4) while booting. Following testing of the memory integrated circuits, the processor 122 may extract the failure data from the memory 126 (e.g., using the process 80 of FIG. 5) in order to form a memory map describing the addresses of the defective memory cells. The memory map allows the processor 122 to avoid writing data to or reading data from the memory cells that were identified as being defective.

Examples of systems where the computer system 120 finds application include personal/portable computers, camcorders, televisions, automobile electronic systems, microwave ovens and other home and industrial appliances.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A memory integrated circuit comprising:
    a memory array; and
    an internal test circuit that receives an expect data signal generated by a source other than the internal test circuit itself, the internal test circuit comprising:
        an expect data register;
        a comparison circuit having a first input coupled to an output of the memory array and a second input coupled to an output of the expect data register, the comparison circuit being operative to generate an output indicative of a comparison between signals applied to the first and second inputs; and
        a fail data register having an input coupled to receive the output of the comparison circuit, the fail data register storing data corresponding to the output of the comparison circuit.

2. The memory integrated circuit of claim 1 wherein the comparison circuit output is a bus, the internal test circuit further comprising:
    a failed cell address register within the fail data register and including first inputs coupled to the address bus;
    an OR gate having inputs each coupled to one bit of the comparison circuit output bus; and
    an AND gate having a first input coupled to an output of the OR gate, a second input coupled to an output of a clock signal buffer and an output coupled to a clock input of the failed cell address register, the failed address cell register incrementing to a next successive storage location and storing an address of a failed memory cell when a signal on the comparison circuit output bus indicates a failed memory cell.

3. The memory integrated circuit of claim 1 wherein the fail data register comprises a single-bit or multi-bit counter that stores data corresponding to the output of the comparison circuit, the output of the comparison circuit being indicative of whether a comparison mismatch between the signals applied to the first and second inputs has occurred and not being indicative of the address of the comparison mismatch.

4. The memory integrated circuit of claim 1, further comprising an I/O port between one and sixty-four bits wide, the I/O port coupled to an input of the expect data register and to an input of the memory array.

5. The memory integrated circuit of claim 1 wherein the fail data register comprises a first failed test counter responsive to the output of the comparison circuit, the first failed test counter incrementing to a next successive value when the comparison circuit indicates a failure in the memory array during a first test carried out at a first clock frequency.

6. The memory integrated circuit of claim 5, further comprising a second failed test counter responsive to the output of the comparison circuit, the second failed test counter incrementing to a next successive value when the comparison circuit indicates a failure in the memory array during a second test carried out using a second clock frequency.

7. An integrated circuit comprising:
    a function circuit;
    an expect data register;
    a comparison circuit having first inputs coupled to the outputs of the function circuit and second inputs coupled to outputs of the expect data register; and
    a fail data register having an input coupled to an output of the comparison circuit, wherein the integrated circuit receives an expect data signal generated by a source other than the internal test circuit itself.

8. The integrated circuit of claim 7 wherein the comparison circuit generates an output signal indicative of a memory cell failure when data from the function circuit do not agree with corresponding data from the expect data register and wherein the fail data register comprises a counter incrementing in response to the comparison circuit output signal.

9. The integrated circuit of claim 7 wherein the function circuit comprises a processor.

10. The integrated circuit of claim 7 wherein the function circuit comprises a read-write memory.

11. The integrated circuit of claim 7 wherein the function circuit comprises a read-write memory and the fail data register further includes a failed address register, the failed address register incrementing and storing an address of a faulty memory cell in the read-write memory in response to an output signal from the output of the comparison circuit indicative of the faulty memory cell.

12. The integrated circuit of claim 8 wherein the fail data register further comprises an overflow flag that is set when a number of failures of the function circuit exceeds a predetermined number.

13. A computer system comprising:

a data and address bus;

a central processing unit coupled to the data and address bus;

an input device coupled to data and address bus;

a display coupled to the data and address bus; and a memory coupled to the central processing unit, the memory including a ROM storing instructions providing an operating system for the central processing unit and including a read-write memory providing temporary storage of data, the read-write memory including memory integrated circuits each comprising:

a memory array; and an internal test circuit that receives an expect data signal generated by a source other than the internal test circuit itself, the internal test circuit comprising:

an expect data register;

a comparison circuit including first inputs coupled to outputs of the expect data register and second inputs coupled to the memory array; and a fail data register having an input coupled to an output of the comparison circuit, the fail data register storing information describing failed cells in the memory array.

14. The computer system of claim 13, further comprising a failed cell address register having first inputs coupled to the memory array and having a clock input coupled to the output of the comparison circuit, the failed cell address register incrementing to a next successive storage location and storing an address of a memory cell when the comparison circuit output indicates a failure of the memory cell.

15. The computer system of claim 13, further comprising an input coupled to the internal test circuit for setting the internal test circuit to a test mode or to a pass-through mode.

16. The computer system of claim 13 wherein the fail data register comprises a failed test counter responsive to the output of the comparison circuit, the failed test counter incrementing to a next successive value when a comparison of function circuit output data and expect data indicates a failure in the function circuit.

17. An integrated circuit including an on-chip test circuit comprising:

an expect data buffer having an input bus coupled to a source of expect data and having an output bus;

a function circuit having inputs coupled to a source of background data;

a data compare circuit having a first set of inputs coupled to outputs of the function circuit and a second set of inputs coupled to the output bus of the expect data buffer; and a fail data register having an input coupled to an output of the data compare circuit, wherein the source of expect data is a source other than the on-chip test circuit itself.

18. The integrated circuit of claim 17, the on-chip test circuit further comprising:

an OR gate having inputs each coupled to a bit of an output bus of the data compare circuit; and an AND gate having a first input coupled to an output of the OR gate, a second input coupled to a clock signal source and an output coupled to a clock input of the fail data register.

19. The integrated circuit of claim 17 wherein the fail data register comprises a failed test counter responsive to the output of the data compare circuit, the failed test counter incrementing to a next successive value when the data compare circuit performs a comparison of function circuit output data and expect data that indicates a failure in the function circuit.

20. The integrated circuit of claim 17, further comprising a test mode enable circuit having an output coupled to a reset input to the fail data register.

21. The integrated circuit of claim 17 wherein the fail data register comprises a plurality of sub-registers each adapted to store failure data from a separate group of tests.

22. A method for speed grading an integrated circuit having an on-chip test circuit comprising:

testing a function circuit in the integrated circuit at a first clock frequency using expect data provided by a source other than the on-chip test circuit to provide a first set of failure data;

storing the first set of failure data in a fail data register in the integrated circuit;

testing the function circuit at a second clock frequency using expect data generated by a source other than the on-chip test circuit to provide a second set of failure data;

storing the second set of failure data in the fail data register; and downloading the first and second sets of failure data to an integrated circuit tester.

23. The method of claim 22, further comprising:

comparing the first and second sets of failure data in the integrated circuit tester; and determining a maximum clock frequency at which the function circuit operates reliably.

24. The method of claim 22 wherein downloading the first and second sets of failure data comprises:

receiving a download data signal;

coupling an output of the data fail register to an I/O port of the integrated circuit; and coupling the first and second sets of failure data to the I/O port.

25. The method of claim 22 wherein the first and second sets of failure data comprise data other than address data, and wherein the storing the first and second sets of failure data in a fail data register comprises storing the first and second sets of failure data in a first and second counter, respectively.

26. The method of claim 22 wherein testing a function circuit in an integrated circuit at a first clock frequency to provide a first set of failure data comprises:

applying a first clock signal having the first clock frequency to the integrated circuit;

supplying a first set of background data to the function circuit;

supplying a first set of expect data to an expect data register in the integrated circuit;

receiving, in response to the first set of background data, first read data from the function circuit by a comparison circuit contained in the integrated circuit;

receiving, in the comparison circuit, first expect data corresponding to the first read data; and comparing the first read data with the corresponding first expect data to provide the first set of failure data when the first read data do not match the corresponding first expect data.

27. The method of claim 26 wherein testing the function circuit at a second clock frequency to provide a second set of failure data comprises:

applying a second clock signal having the second clock frequency to the integrated circuit;

supplying a second set of background data to the function circuit;

supplying a second set of expect data to the expect data register;

receiving, in response to the second set of background data, second read data from the function circuit by the comparison circuit;

receiving, in the comparison circuit, second expect data corresponding to the second read data; and comparing the second read data to the corresponding second expect data to provide the second set of failure data when the second read data do not match the corresponding second expect data.

28. In an integrated circuit including a function circuit, a method of testing the integrated circuit comprising:

resetting a fail data register in an on-chip test circuit in the integrated circuit;

setting the on-chip test circuit to a testing mode;

coupling background data to the function circuit;

coupling expect data generated by a source other than the on-chip test circuit to the on-chip test circuit;

extracting read data from the function circuit in response to the background data;

comparing, by the internal test circuit, the read data to the corresponding expect data to determine when the function circuit fails; and storing failure data describing the failure of the function circuit in the fail data register when the function circuit fails.

29. The method of claim 28 wherein storing failure data comprises storing data other than address data in a counter indicating a total number of failures in the function circuit.

30. The method of claim 28 wherein storing failure data comprises storing data including addresses for failed memory cells in the function circuit.

31. The method of claim 28 wherein storing failure data comprises:

clocking the fail data register with a clock pulse derived from comparing the read data to the corresponding expect data; and storing failure data in a next sequential memory location in the fail data register.

32. The method of claim 28 wherein coupling expect data precedes coupling background data.

33. The method of claim 28, further comprising:

determining when a test is done; and, when it is determined that the test is done:

reading failure data describing function circuit failures from the fail data register; and coupling the failure data to an I/O port of the integrated circuit.

34. The method of claim 33 wherein reading failure data comprises reading a one-bit flag indicating whether or not at least one function circuit failure occurred.

35. The method of claim 33 wherein reading failure data comprises reading defective memory cell addresses for defective memory cells in the function circuit.

36. The method of claim 33 wherein reading failure data comprises reading an overflow bit to determine when more than a predetermined number of failures occurred in the function circuit.

37. The method of claim 33 wherein reading failure data comprises reading first failure data from a first test performed at a first clock frequency.

38. The method of claim 37 wherein reading failure data further comprises reading second failure data from a second test performed at a second clock frequency different than the first clock frequency.

39. A method for testing a memory in an integrated circuit comprising:

determining when a memory cell in the memory fails by comparing read data from the memory cell to expect data generated by a source other than an on-chip test circuit; and storing data describing failure of the memory cell in a fail data register in the integrated circuit.

40. The method of claim 39 wherein storing data comprises setting a flag indicating that at least one memory cell failed.

41. The method of claim 39 wherein storing data comprises incrementing a counter.

42. The method of claim 39 wherein storing data comprises:

incrementing a counter; and setting an overflow flag when the counter overflows.

43. The method of claim 39 wherein storing data comprises storing data other than an address for the memory cell that failed in a counter.

44. The method of claim 39 wherein storing data comprises storing a total number of memory cells in the memory that failed.

45. The method of claim 39 wherein determining when a memory cell fails comprises determining when a memory cell in a dynamic random access memory fails.

46. The method of claim 39 wherein determining when a memory cell fails comprises:

coupling background data to the memory;

coupling expect data to an expect data register in an on-chip test circuit in the integrated circuit;

reading read data from the memory;

reading expect data corresponding to the read data from the expect data register;

comparing the read data to the corresponding expect data by the on-chip test circuit to determine when a memory cell in the memory fails; and executing the storing step when the memory cell fails.

47. The method of claim 46, further comprising, prior to coupling background data to the memory:

resetting the fail data register; and setting the on-chip test circuit to a testing mode.

48. A method for testing a plurality of integrated circuits comprising:

coupling a common data bus to an I/O port of each integrated circuit;

coupling a dedicated control line to each of the integrated circuits;

supplying test data to the common data bus;

determining, within each integrated circuit, when a failure occurs in a function circuit in the integrated circuit; and storing data in a counter describing the failure in the integrated circuit that had the failure occur when a failure is determined to have occurred.

49. The method of claim 48 wherein determining, within each integrated circuit, when a failure occurs comprises:

reading read data from the function circuit;

reading expect data generated by a source other than an on-chip test circuit corresponding to the read data; and comparing the read data to the corresponding expect data by the on-chip test circuit to determine when the function circuit fails.

50. The method of claim 48 wherein supplying test data to the data bus comprises:
coupling background data to each function circuit; and
coupling expect data to an expect data register in an on-chip test circuit in each integrated circuit.

51. The method of claim 50, further comprising, prior to coupling background data to each function circuit, setting the on-chip test circuit to a testing mode.

52. A method for speed grading a plurality of integrated circuits comprising:
coupling a common data bus to an I/O port of each integrated circuit;
coupling a separate dedicated control line to each of the integrated circuits;
supplying a first clock signal having a first frequency to each of the integrated circuits;
supplying first test data to the common data bus;
determining, within each integrated circuit, when a failure occurs in a function circuit in the integrated circuit;
storing, in a counter in the integrated circuit that had the failure, first failure data describing the failure when a failure has occurred;
supplying a second clock signal having a second clock frequency to each of the integrated circuits;
supplying second test data to the common data bus;
determining, within each integrated circuit, when a failure occurs in the function circuit; and
storing, in the counter in the integrated circuit that had the failure, second failure data describing the failure when a failure has occurred.

53. The method of claim 52, further comprising:
selecting, by an automated tester coupled to the common data bus, a first integrated circuit from which to download failure data;
sending a signal enabling downloading of failure data to the first integrated circuit over a first dedicated line coupled to the first integrated circuit; and
transmitting the first and second failure data from the first integrated circuit to the automated tester through the common data bus.

54. The method of claim 53, further comprising:
selecting, by the automated tester, a second integrated circuit from which to download failure data;
sending a signal enabling downloading of failure data to the second integrated circuit over a second dedicated line coupled to the second integrated circuit; and
transmitting the first and second failure data from the second integrated circuit to the automated tester through the common data bus.

55. The method of claim 53, further comprising:
analyzing the first and second failure data; and
determining a maximum clock frequency for the first integrated circuit from the first and second failure data.

56. A memory integrated circuit, comprising:
a memory array; and
an internal test circuit that receives an expect data signal generated by a source other than the internal test circuit itself, the internal test circuit comprising:
a comparison circuit having a first input coupled to an output of the memory array and a second input that receives the expect data signal, the comparison circuit being operative to generate an output indicative of a comparison between signals applied to the first and second inputs; and
a fail data register having an input coupled to receive the output of the comparison circuit, the fail data register storing data corresponding to the output of the comparison circuit.

57. The memory integrated circuit of claim 56, further comprising an expect data register coupled to the second input of the comparison circuit, the expect data register receiving the expect data signal and transmitting the expect data signal to the comparison circuit.

58. The memory integrated circuit of claim 56 wherein the fail data register comprises a single-bit or multi-bit counter that stores data corresponding to the output of the comparison circuit, the output of the comparison circuit being indicative of whether a comparison mismatch between the signals applied to the first and second inputs has occurred and not being indicative of the address of the comparison mismatch.

59. The memory integrated circuit of claim 56 wherein the fail data register comprises a first failed test counter responsive to the output of the comparison circuit, the first failed test counter incrementing to a next successive value when the comparison circuit indicates a failure in the memory array during a first test carried out at a first clock frequency.

60. An integrated circuit, comprising:
a function circuit;
a comparison circuit having a first input coupled to an output of the function circuit and a second input that receives an expect data signal generated by a source other than the integrated circuit itself; and
a fail data register having an input coupled to an output of the comparison circuit.

61. The integrated circuit of claim 60, further comprising an expect data register coupled to the second input of the comparison circuit, the expect data register receiving the expect data signal and transmitting the expect data signal to the comparison circuit.

62. The integrated circuit of claim 60 wherein the function circuit comprises a processor.

63. The integrated circuit of claim 60 wherein the function circuit comprises a read-write memory.

64. The integrated circuit of claim 60 wherein the fail data register comprises a single-bit or multi-bit counter that stores data corresponding to the output of the comparison circuit, the output of the comparison circuit being indicative of whether a comparison mismatch between the signals applied to the first and second inputs has occurred and not being indicative of the address of the comparison mismatch.

* * * * *

UNITED STATES PATENT AND TRADEMARK OFFICE
CERTIFICATE OF CORRECTION

PATENT NO. : 6,324,657 B1  
DATED : November 27, 2001  
INVENTOR(S) : Wallace E. Fister and Aaron Schoenfeld It is certified that error appears in the above-identified patent and that said Letters Patent is hereby corrected as shown below:

<u>Title page, Item [54] and Column 1, Line 1,</u>  
Reads "ON-CLIP", should read -- ON-CHIP --

<u>Column 2,</u>  
Line 40, reads "for the each" should read -- for each --

<u>Column 3,</u>  
Line 59, reads "e.g" should read -- e.g., --

Signed and Sealed this

Twenty-eighth Day of January, 2003

JAMES E. ROGAN  
*Director of the United States Patent and Trademark Office*